(12) United States Patent
Noethlings et al.

(10) Patent No.: US 7,984,092 B2
(45) Date of Patent: Jul. 19, 2011

(54) FIR FILTER PROCESS AND FIR FILTER ARRANGEMENT

(75) Inventors: Rolf Noethlings, Stuttgart (DE);
Matthias Wagner, Remshalden (DE)

(73) Assignee: Sony Deutschland GmbH, Berlin (DE)

( * ) Notice: Subject to any disclaimer, the term of this patent is extended or adjusted under 35 U.S.C. 154(b) by 1065 days.

(21) Appl. No.: 11/764,330

(22) Filed: Jun. 18, 2007

(65) Prior Publication Data
US 2008/0288567 A1    Nov. 20, 2008

(30) Foreign Application Priority Data
Aug. 23, 2006    (EP) .................................... 06017588

(51) Int. Cl.
*G06F 17/10*    (2006.01)
(52) U.S. Cl. ........................ 708/316; 708/319
(58) Field of Classification Search .................. 708/316, 708/319
See application file for complete search history.

(56) References Cited

U.S. PATENT DOCUMENTS

| | | | | |
|---|---|---|---|---|
| 4,777,612 A | * | 10/1988 | Tomimitsu | 708/316 |
| 4,821,223 A | * | 4/1989 | David | 708/308 |
| 5,831,879 A | * | 11/1998 | Yom et al. | 708/301 |
| 6,510,445 B2 | * | 1/2003 | Takano | 708/319 |
| 2002/0002572 A1 | | 1/2002 | Kanasugi et al. | |

FOREIGN PATENT DOCUMENTS
EP    1 039 635 A1    9/2000
* cited by examiner

*Primary Examiner* — Chuong D Ngo
(74) *Attorney, Agent, or Firm* — Oblon, Spivak, McClelland, Maier & Neustadt, L.L.P.

(57) ABSTRACT

The present invention relates to a FIR filter process ($1'$) and to a respective FIR filter arrangement (1) wherein at least one multiplex mode is given which is characterized in that in the respective summation stage ($30'$) or summation block (30) partial summations are carried out and controlled in conformity with a multiplexed structure underlying a multiplexed input signal (MS) in order to obtain partial sums ($\Sigma p_{k-1}$) as accordingly filtered single signals.

15 Claims, 3 Drawing Sheets

FIR FILTER PROCESS AND FIR FILTER ARRANGEMENT

FIELD OF THE INVENTION

The present invention relates to a FIR filter process or a finite impulse response filter process as well as to a FIR filter arrangement or a finite impulse response filter arrangement. More particular, the present invention relates to a scalable FIR filter process and to a scalable FIR filter.

BACKGROUND OF THE INVENTION

Nowadays, digital signal processing becomes more and more important, for instance in customer devices or the like. At the same time the aim of enabling such devices to have realized a high variety of different functions and also miniaturizing aspects get within the scope of further technical developments.

SUMMARY OF THE INVENTION

It is therefore an object underlying the present invention to provide a FIR filter process as well as a FIR filter arrangement which are capable of realizing with a given process structure or with a given arrangement's structure different possible functionalities.

The object underlying the present invention is solved with a FIR filter process according to the invention with the features of independent claim 1. The object underlying the present invention is also solved with a FIR filter arrangement according to the present invention with the features of independent claim 11. Preferred embodiments of the FIR filter process and of the inventive FIR filter arrangement are within the scope of the respective dependent claims.

A basic aspect underlying the present invention in its broadest sense is to realize a FIR filter process as well as a FIR filter arrangement which are adapted to realize at least one multiplex mode in which in a summation stage or summation block partial summations are carried out and controlled in conformity with the multiplexed structure of a received multiplexed signal in order to obtain partial sums as accordingly filtered single signals.

Therefore, the present invention proposes a respective FIR filter process as well as a respective FIR filter arrangement.

The FIR filter process according to the present invention which is capable of being controllably and switchably operated in a single mode for filtering a single signal and in at least one multiplex mode for filtering a multiplexed signal, wherein in said at least one multiplex mode in a summation stage underlying the FIR filter process partial summations are carried out and controlled in conformity with the multiplex structure underlying said multiplexed signal in order to obtain partial sums as accordingly filtered single signals.

The FIR filter arrangement according to the present invention comprises means for being controllably and switchably operated in a single mode for filtering a single signal and in at least one multiplex mode for filtering a multiplexed signal, wherein in said at least one multiplex mode in a summation block underlying the FIR filter arrangement partial summations are carried out and controlled in conformity with the multiplex structure underlying said multiplexed signal in order to obtain partial sums as accordingly filtered single signals.

BRIEF DESCRIPTION OF THE DRAWINGS

The invention will now be explained based on preferred embodiments thereof and by taking reference to the accompanying and schematical figures.

DETAILED DESCRIPTION OF THE INVENTION

Figure 1:
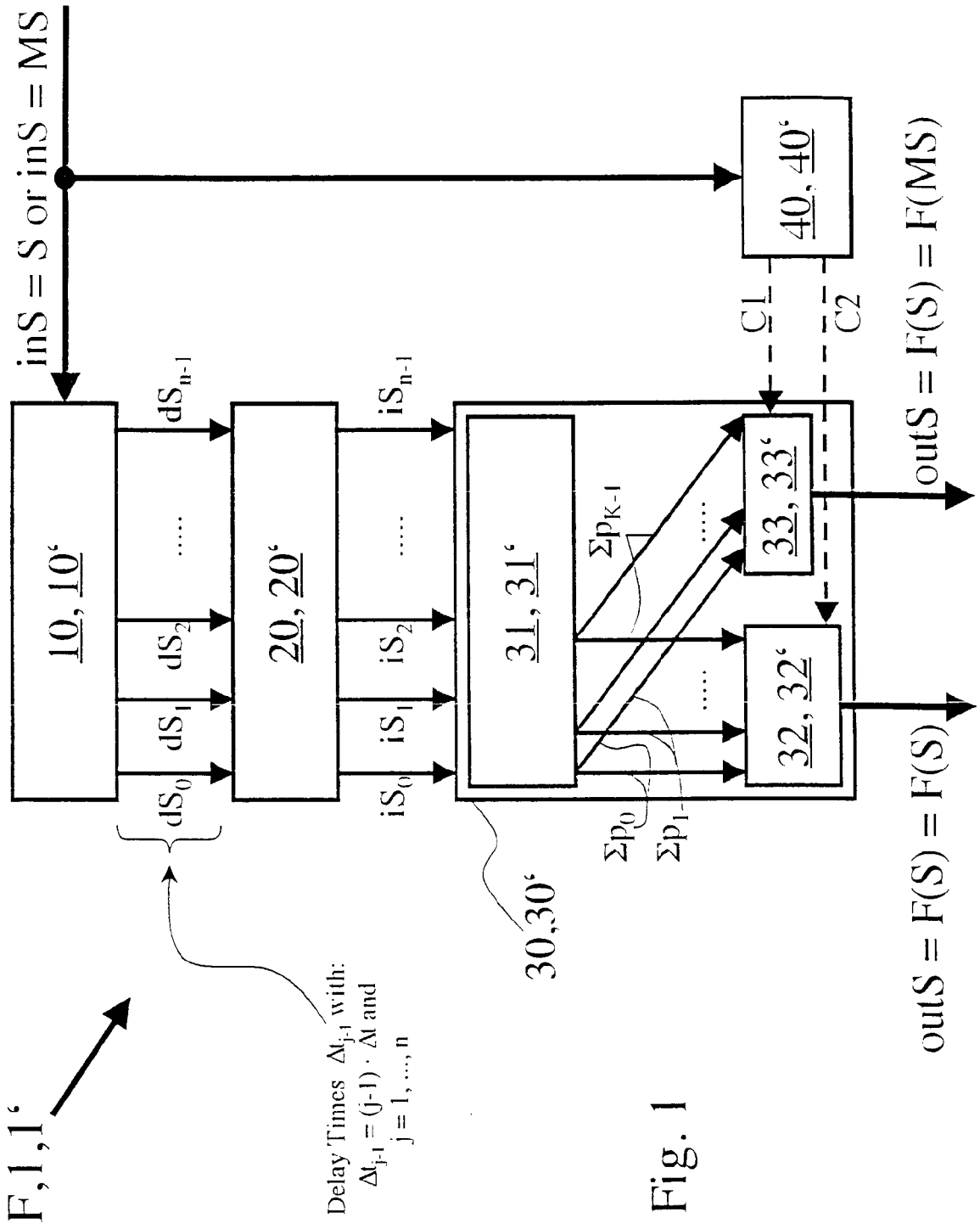
FIG. 1 is a schematical block diagram for elucidating the basic structure of a preferred embodiment of the FIR filter process/arrangement according to the present invention.

In the following functional and structural similar or equivalent element structures will be denoted with the same reference symbols. Not in each case of their occurrence a detailed description will be repeated.

In the following, reference is taken to the Figs. in general:

The present invention relates to a FIR filter process 1' and to a respective FIR filter arrangement 1 wherein at least one multiplex mode is given which is characterized in that in the respective summation stage 30' or summation block 30 partial summations are carried out and controlled in conformity with a multiplexed structure underlying a multiplexed input signal MS in order to obtain partial sums $\Sigma p_{k-1}$ as accordingly filtered single signals.

The FIR filter process 1' according to the present invention which is capable of being controllably and switchably operated in a single mode for filtering a single signal S and in at least one multiplex mode for filtering a multiplexed signal MS, wherein in said at least one multiplexed mode in a summation stage 30' underlying the FIR filter process 1' partial summations are carried out and controlled in conformity with the multiplex structure underlying said multiplexed signal MS in order to obtain partial sums $\Sigma p_{k-1}$ as accordingly filtered single signals.

In said single mode an input signal inS may be received and assumed to be constituted by a single signal S, intermediate filter signals $iS_{j-1}$ may be generated, on the entirety of intermediate filter signals $iS_{j-1}$ certain partial summations may be carried out in order to obtain respective partial sums $\Sigma p_{k-1}$, the entirety of said intermediate filter signals $iS_{j-1}$ is summed in order to obtain an entire sum $\Sigma$, wherein said entire sum $\Sigma$ is formed by summing said previously formed partial sums $\Sigma p_{k-1}$ into one single value, and said entire sum $\Sigma$ may be output as a single output signal outS and as a filtered single input signal inS, S.

In said at least one multiplex mode an input signal inS may be received and assumed to be a multiplex signal MS of a given and fixed number of multiplexed single signals S with a given multiplexed structure, intermediate filter signals $iS_{j-1}$ are generated, on the entirety of intermediate filter signals $iS_{j-1}$ certain partial summations are carried out in order to obtain respective partial sums $\Sigma p_{k-1}$ and said partial summations being carried out and controlled in conformity with said multiplex structure of said multiplexed single signals S in order to obtain said partial sums $\Sigma p_{k-1}$ as accordingly filtered single signals S.

Said partial sums $\Sigma p_{k-1}$ may be output as output signals outS via separated channels.

The entirety of said partial sums $\Sigma p_{k-1}$ is formed into and output as a common multiplexed output signal outS.

The process 1' may comprise a delay stage 10' which is adapted to generate from said input signal inS n delayed signals $dS_{j-1}$ with n and j being integers, n>1 and $1 \leq j \leq n$, in particular with delay times $\Delta t_{j-1}$ being j−1-times a given minimum delay time $\Delta t$ and with $dS_0$ being the non-delayed or undelayed signal.

The process 1' may comprise a multiplication stage 20' which is adapted in order to generate from said delayed signals $dS_{j-1}$ said intermediate filter signals $iS_{j-1}$ by multiplying each of said delayed signals $dS_{j-1}$ with a respective given filter coefficient $h_{j-1}$.

The process 1' may comprise a pre-summation stage 31' which is adapted to generate said partial sums $\Sigma p_{k-1}$, k=1, . . . , K from said entirety of said intermediate filter signals $iS_{j-1}$ by summing from said entirety of said intermediate filter signals $iS_{j-1}$ subsets which are in each case assigned to a given component of the multiplexed input signal inS=MS.

The process 1' may comprise a final summation stage 32' which is adapted to generate from said partial sums $\Sigma p_{k-1}$ said entire sum $\Sigma$ by adding the entirety of said partial sums $\Sigma p_{k-1}$ in a controllable manner if and only if a single signal S is given as said input signal inS.

The process 1' may comprise a multiplexing stage 33' which is adapted to receive said partial sums $\Sigma p_{k-1}$ and to generate from said partial sums $\Sigma p_{k-1}$ said multiplexed output signal outS in a controllable manner if and only if a multiplexed signal MS is given as said input signal inS.

The FIR filter arrangement 1 according to the present invention comprises means for being controllably and switchably operated in a single mode for filtering a single signal S and in at least one multiplex mode for filtering a multiplexed signal MS, wherein in said at least one multiplexed mode in a summation block 30 underlying the FIR filter arrangement 1 partial summations are carried out and controlled in conformity with the multiplex structure underlying said multiplexed signal MS in order to obtain partial sums $\Sigma p_k$ as accordingly filtered single signals.

In said single mode an input signal inS may be received and assumed to be constituted by a single signal S, intermediate filter signals $iS_{j-1}$ may be generated, on the entirety of intermediate filter signals $iS_{j-1}$ certain partial summations may be carried out in order to obtain respective partial sums $\Sigma p_{k-1}$, the entirety of said intermediate filter signals $iS_{j-1}$ is summed in order to obtain an entire sum $\Sigma$, wherein said entire sum $\Sigma$ is formed by summing said previously formed partial sums $\Sigma p_{k-1}$ into one single value, and said entire sum $\Sigma$ may be output as a single output signal outS and as a filtered single input signal inS, S.

In said at least one multiplex mode an input signal inS may be received and assumed to be a multiplex signal MS of a given and fixed number of multiplexed single signals S with a given multiplexed structure, intermediate filter signals $iS_{j-1}$ may be generated, on the entirety of intermediate filter signals $iS_{j-1}$ certain partial summations may be carried out in order to obtain respective partial sums $\Sigma p_{k-1}$ and said partial summations being carried out and controlled in conformity with said multiplex structure of said multiplexed single signals S in order to obtain said partial sums $\Sigma p_{k-1}$ as accordingly filtered single signals S.

The arrangement 1 may comprise means in order to output said partial sums $\Sigma p_{k-1}$ as output signals outS via separated channels.

The arrangement 1 may comprise means so that the entirety of said partial sums $\Sigma p_{k-1}$ is formed into and output as a common multiplexed output signal outS.

The arrangement 1 may comprise a delay block 10 which is adapted to generate from said input signal inS n delayed signals $dS_{j-1}$ with n and j being integers, n>1 and 1≦j≦n, in particular with delay times $\Delta t_{j-1}$ being j−1-times a given minimum delay time $\Delta t$.

The arrangement 1 may comprise a multiplication block 20 which is adapted in order to generate from said delayed signals $dS_{j-1}$ said intermediate filter signals $iS_{j-1}$ by multiplying each of said delayed signals $dS_{j-1}$ with a respective given filter coefficient $h_{j-1}$.

The arrangement 1 may comprise a pre-summation block 31 which is adapted to generate said partial sums $\Sigma p_{k-1}$, k=1, . . . , K from said entirety of said intermediate filter signals $iS_{j-1}$ by summing from said entirety of said intermediate filter signals $iS_{j-1}$ subsets which are in each case assigned to a given component of the multiplexed input signal inS=MS.

The arrangement 1 may comprise a final summation block 32 which is adapted to generate from said partial sums $\Sigma p_{k-1}$ said entire sum $\Sigma$ by adding the entirety of said partial sums $\Sigma p_{k-1}$ in a controllable manner if and only if a single signal S is given as said input signal inS.

The arrangement 1 may comprise a multiplexing block 33 which is adapted to receive said partial sums $\Sigma p_{k-1}$ and to generate from said partial sums $\Sigma p_{k-1}$ said multiplexed output signal outS in a controllable manner if and only if a multiplexed signal MS is given as said input signal inS.

These and further aspects of the present invention will be further discussed in the following:

The present invention also relates to Scalable FIR Filter.

In digital signal processing often resource sharing is needed in order to keep the size/area of a digital chip as small as possible.

This invention inter alia proposes an architecture for a FIR filter, able to easily exchange filter performance (number of filter coefficients) versus number of multiplexed signals to be filtered.

The filter can be operated in different modes, i.e. it can be adopted to different tasks with only one instantiation/implementation on a chip: e.g. filtering one signal with a long filter, or filtering many signals with respectively shorter filters. It trades off the quality of filter versus the number of multiplexed signals.

In the DIA-TV project a digital demodulation for Analogue TV and Radio Broadcasting Signals is to be designed and implemented. Especially in the related sound processing part different signals (of different standards/characteristic) need to be processed, while the system has to be kept as small as possible. I.e. only one instance/implementation of e.g. a filter should be capable to process signals of different characteristics in an effective way, using minimal resources.

A basic idea for the flexible filter is to split the FIR filter equation, which is basically a big sum, into intermediate sums in a special order. These sums are supposed to be either entire filter results for different/multiplexed signals, and output separately, or they are intermediate sums, which are finally added together themselves again, when the structure is operated as one large filter for a single input signal.

Figure 2:
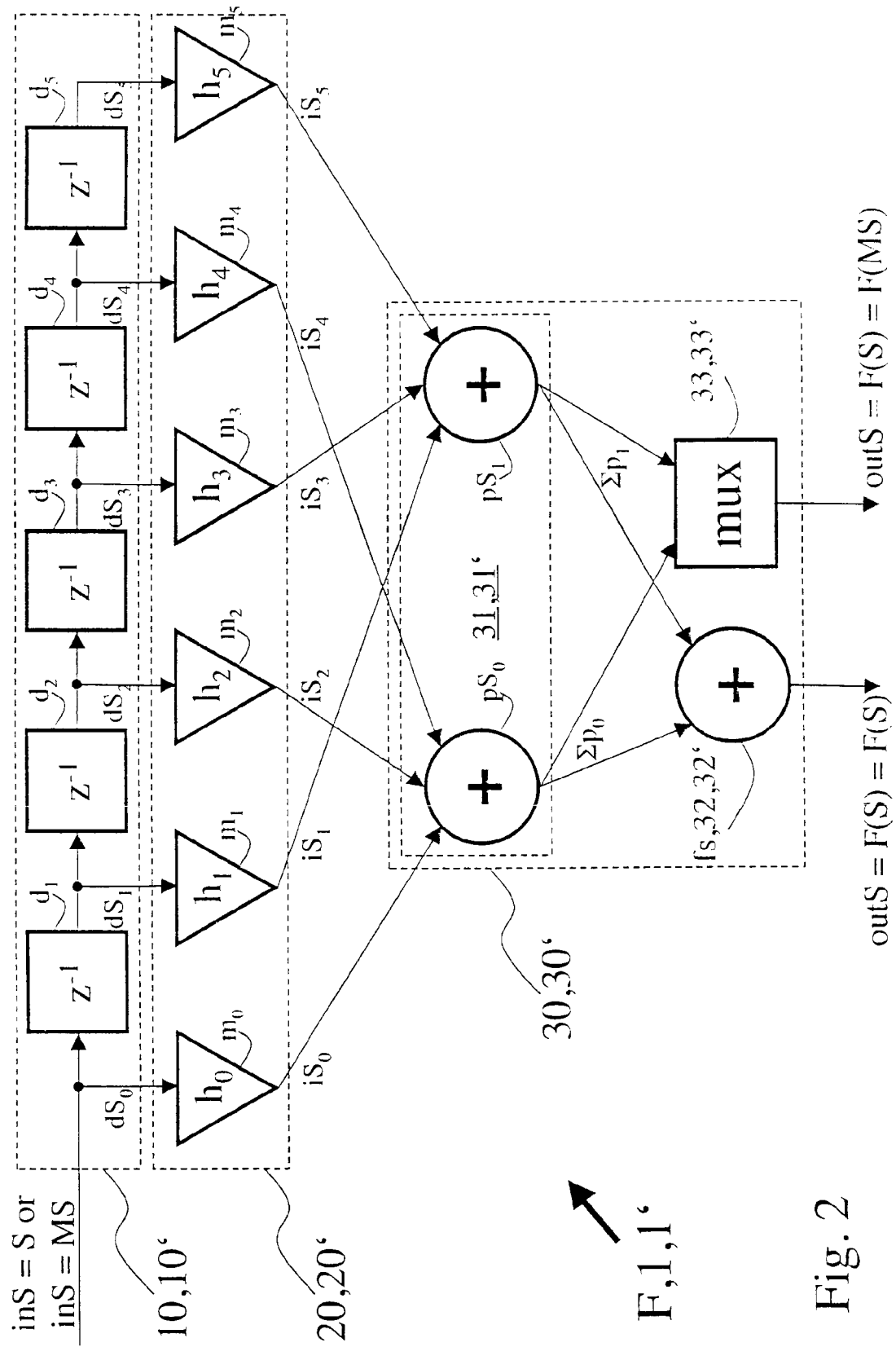
FIG. 2 as a schematical block diagram for elucidating a second preferred embodiment of the FIR filter process/arrangement which is capable of processing a double multiplexed input signal.

The following equation (1)

$$y(n) = \sum_{k=0}^{M} h_k x(n-k) = \sum_{\substack{k=0 \\ even}}^{M} h_k x(n-k) + \sum_{\substack{k=1 \\ odd}}^{M} h_k x(n-k) \qquad (1)$$

and the block diagram—in particular of FIG. 2—illustrate the system for a structure, capable to filter one signal with a 6 tap FIR filter using the sum output, or to filter two multiplexed signals (e.g. a complex signal) with a 3 tap FIR filter using the mux or multiplex output.

In this case every 2nd sample multiplied by the respective filter coefficient is summed up, for the equal numbered and the unequal numbered samples separately. In case the structure is meant to be one single filter for one single input, both sums are added to obtain the output signal. In case two multiplexed signal shall be filtered, both intermediate sums provide one output sample of the respective multiplexed signals each.

Of cause the proposed filter architecture can be adapted to filter n-times multiplexed signal as well (every n-th sample for one intermediate sum). Moreover additional measures to increase resource sharing can be combined, taking e.g. advantage of filter symmetry or operating the filter at a higher clock rate in order to reduce the number of instantiated multipliers or the like.

Now, explicit reference ist taken to the Figs.

FIG. 1 is a schematical block diagram for elucidating a first preferred embodiment of the FIR filter process 1' and of the FIR filter arrangement 1 according to the present invention. Therefore, FIG. 1 reflects a possible device structure for an inventive arrangement 1 as well as a possible procedural structure for an inventive method 1'.

In the following the procedural structure is explained:

According to the present invention the FIR filter process 1' comprises a delay stage 10' in which a received input signal inS is delayed n times in order to generate n delayed signals $dS_{j-1}$. n and j are integers and fulfil the relations n>1 and $1 \leq j \leq n$. Thereby, the delayed signals $dS_{j-1}$ are copies of the input signal inS or of components thereof having delay times $\Delta t_{j-1}$ which are for instance (j−1)-times given minimum delay time $\Delta t$, i.e. $\Delta t_{j-1} = (j-1) \cdot \Delta t$.

The delayed signals $dS_{j-1}$ are fed into a following multiplication stage 20'. Said multiplication stage 20' is adapted in order to generate from the received delayed signals $dS_{j-1}$ intermediate filter signals $iS_{j-1}$ by multiplying each of said delayed signals $dS_{j-1}$ with a respective given filter coefficient $h_{j-1}$. Said filter coefficients $h_{j-1}$ are given in predefined entities and characterize the FIR filter process 1' as such.

The generated intermediate filter signals $iS_{j-1}$ are fed into a following summation and output stage 30'. According to the present invention this summation and output stage 30' is subdivided into a pre-summation stage 31' as well as into a final summation stage 32' and a multiplexing stage 33'. The pre-summation stage 32' and the multiplexing stage 33' are alternatively selected or switched to operation in dependence of the quality of the input signal inS either being a single signal S or being a multiplexed signal MS which is itself a multiplexed structure of given single signals S.

First of all, the pre-summation stage 31' receives from the multiplication stage 20' said intermediate filter signals $iS_{j-1}$. The pre-summation stage 31' is adapted in order to generate partial sums $\Delta p_{k-1}$. k is an integer with $1 \leq k \leq K$. K is an integer and characterizes the degree of the possible multiplexed signal MS. Therefore, K is in general the number of single signals S which are multiplexed into said multiplexed signal MS, i.e. k=2 for two single signals S multiplexed into said multiplexed signal MS, k=3 for three single signals multiplexed into said multiplexed signal MS and so on.

A comparable simple structure for the FIR filter process is given if K is commensurable with respect to n, i.e. if n can be divided by K without remainder.

In said pre-summation stage 31' the partial sums $\Sigma p_{k-1}$ are formed by summing up or by adding from said entirety of said intermediate filter signals $iS_{j-1}$ the respective intermediate filter signals $iS_{j-1}$ which are assigned to and which belong to a respective order which is in the case of a multiplexed input signal inS=MS in conformity with the underlying multiplexed structure.

For K=2, even numbered intermediate filter signals $iS_0$, $iS_2$, $iS_4$, . . . are added on the one hand and odd numbered intermediate filter signals $iS_1$, $iS_3$, $iS_5$, . . . are added on the other hand in order to obtain partial sums $\Sigma p_0$ and $\Sigma p_1$, respectively.

For K=3 $iS_0$, $iS_3$, $iS_6$, . . . form $\Sigma p_0$, $iS_1$, $iS_4$, $iS_7$, . . . form $\Sigma p_1$, and $iS_2$, $iS_5$, $iS_8$, . . . , form $\Sigma p_2$.

The partial sums $\Sigma p_{k-1}$ with k=1, . . . , K are forwarded to the final summation stage 32' as well as to the multiplexing stage 33'.

In the case that the input signal inS is a single signal S, the final summation stage 32' is activated in order to sum up the partial sums $\Sigma p_k$ to the final sum $\Sigma = \Sigma p_0 + \ldots + \Sigma p_{k-1}$.

For the case that the input signal inS is a multiplexed signal MS the multiplexing stage 33' is activated, in order to provide the respective partial sums $\Sigma p_k$ as filtered components of the multiplexed input signal MS.

Consequently, the output signal outS is in the former case given as a filtered single signal F(S) and in the latter case as a filtered multiplexed signal F(MS) if F denotes the filter operation of the FIR filter process 1'.

In order to control the activation of the final summation stage 32' and of the multiplexing stage 33' a controlling stage 40' may be provided which is adapted by some means to analyze the input signal inS to be a single signal S or to be a multiplexed signal MS. For a single signal S the final summation stage 32' is activated. In the case of a multiplexed signal MS a multiplexing stage 33' is activated.

Now, the device structure is explained:

According to the present invention the FIR filter arrangement 1 comprises a delay block 10 in which a received input signal inS is delayed n times in order to generate n delayed signals $dS_{j-1}$. n and j are integers and fulfil the relations n>1 and $1 \leq j \leq n$. Thereby, the delayed signals $dS_{j-1}$ are copies of the input signal inS or of components thereof having delay times $\Delta t_{j-1}$ which are for instance (j−1)-times given minimum delay time $\Delta t$, i.e. $\Delta t_{j-1} = (j-1) \cdot \Delta t$.

The delayed signals $dS_{j-1}$ are fed into a following multiplication block 20. Said multiplication block 20 is adapted in order to generate from the received delayed signals $dS_{j-1}$ intermediate filter signals $iS_{j-1}$ by multiplying each of said delayed signals $dS_{j-1}$ with a respective given filter coefficient $h_{j-1}$. Said filter coefficients $h_{j-1}$ are given in predefined entities and characterize the FIR filter arrangement 1 as such.

The generated intermediate filter signals $iS_{j-1}$ are fed into a following summation and output block 30. According to the present invention this summation and output block 30 is subdivided into a pre-summation block 31 as well as into a final summation block 32 and a multiplexing block 33. The pre-summation block 32 and the multiplexing block 33 are alternatively selected or switched to operation in dependence of the quality of the input signal inS either being a single signal S or being a multiplexed signal MS which is itself a multiplexed structure of given single signals S.

First of all, the pre-summation block 31 receives from the multiplication block 20 said intermediate filter signals $iS_{j-1}$. The pre-summation block 31 is adapted in order to generate partial sums $\Delta p_{k-1}$. k is an integer with $1 \leq k \leq K$. K is an integer and characterizes the degree of the possible multiplexed signal MS. Therefore, K is in general the number of single signals S which are multiplexed into said multiplexed signal MS, i.e. k=2 for two single signals S multiplexed into said multiplexed signal MS, k=3 for three single signals multiplexed into said multiplexed signal MS and so on.

A comparable simple structure for the FIR filter arrangement is given if K is commensurable with respect to n, i.e. if n can be divided by K without remainder.

In said pre-summation block 31 the partial sums $\Sigma p_{k-1}$ are formed by summing up or by adding from said entirety of said intermediate filter signals $iS_{j-1}$ the respective intermediate filter signals $iS_{j-1}$ which are assigned to and which belong to a respective order which is in the case of a multiplexed input signal inS=MS in conformity with the underlying multiplexed structure.

Again, for K=2, even numbered intermediate filter signals $iS_0, iS_2, iS_4, \ldots$ are added on the one hand and odd numbered intermediate filter signals $iS_1, iS_3, iS_5, \ldots$ are added on the other hand in order to obtain partial sums $\Sigma p_0$ and $\Sigma p_1$, respectively.

Again, for K=3, $iS_0, iS_3, iS_6, \ldots$ form $\Sigma p_0$, $iS_1, iS_4, iS_7, \ldots$ form $\Sigma p_1$, and $iS_2, iS_5, iS_8, \ldots$, form $\Sigma p_2$.

The partial sums $\Sigma p_{k-1}$ with $k=1, \ldots, K$ are forwarded to the final summation block 32 as well as to the multiplexing block 33.

In the case that the input signal inS is a single signal S, the final summation block 32 is activated in order to sum up the partial sums $\Sigma p_k$ to the final sum $\Sigma = \Sigma p_0 + \ldots + \Sigma p_{K-1}$.

For the case that the input signal inS is a multiplexed signal MS the multiplexing block 33 is activated, in order to provide the respective partial sums $\Sigma p_k$ as filtered components of the multiplexed input signal MS.

Consequently, the output signal outS is in the former case given as a filtered single signal F(S) and in the latter case as a filtered multiplexed signal F(MS) if F denotes the filter operation of the FIR filter arrangement 1.

In order to control the activation of the final summation block 32 and of the multiplexing block 33 a controlling block 40 may be provided which is adapted by some means to analyze the input signal inS to be a single signal S or to be a multiplexed signal MS. For a single signal S the final summation block 32 is activated. In the case of a multiplexed signal MS a multiplexing block 33 is activated.

Figure 3:
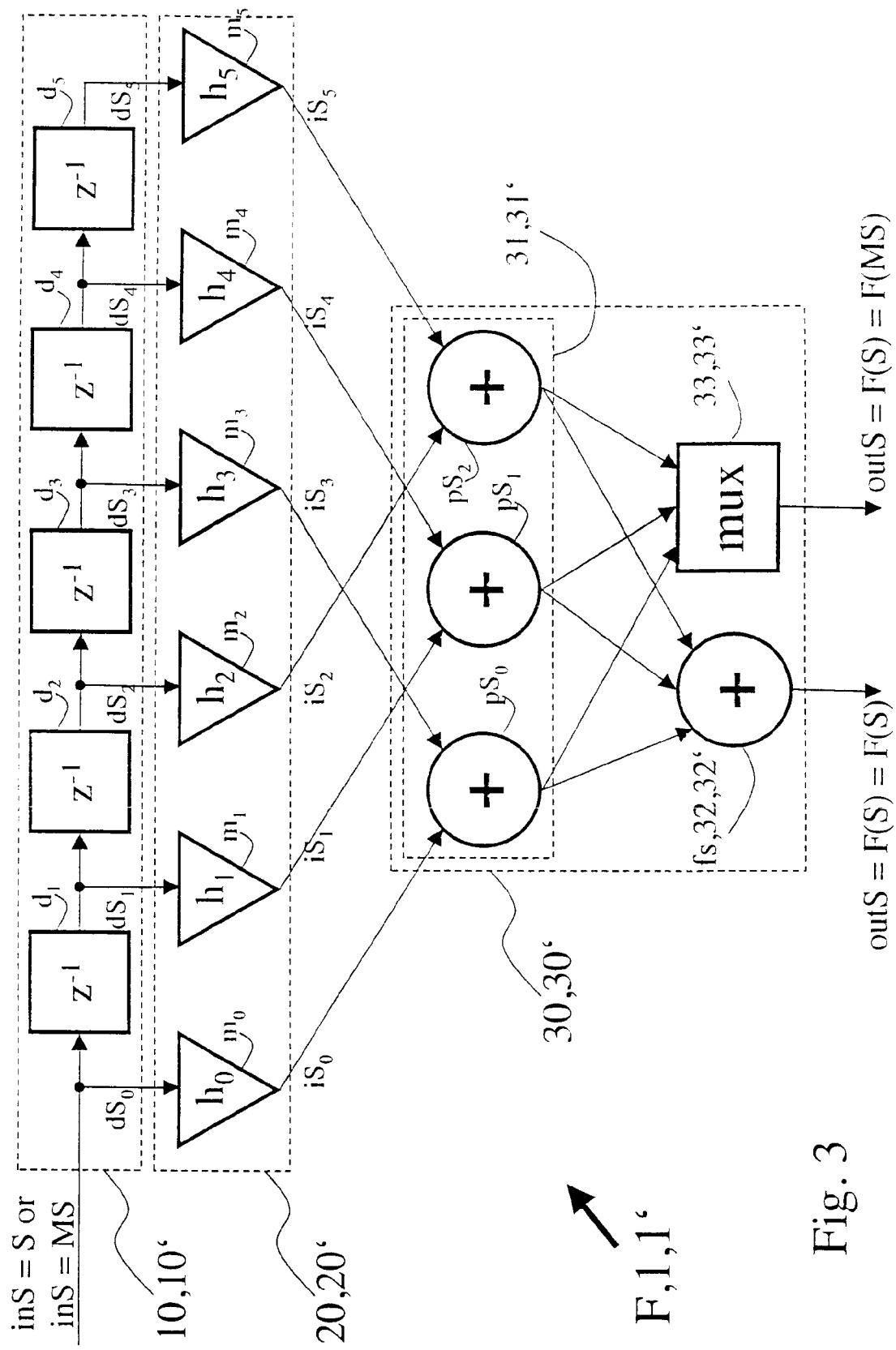
FIG. 3 as a schematical block diagram for elucidating a third preferred embodiment of the FIR filter process/arrangement which is capable of processing a triple multiplexed input signal.

FIGS. 2 and 3 elucidate in more detail the structure of the different stages and blocks of embodiments of the FIR filter process 1' and the FIR filter arrangement 1 according to the present invention which are adapted for doubled multiplexed input signals inS=MS and for triple multiplexed input signals inS=MS, respectively.

Again, FIGS. 2 and 3 represent both the procedural as well as the device structure of the present invention.

In each case the delay stage 10' and the delay block 10 are constituted by respective delay steps or elements $d_0, \ldots, d_{n-1}$. The multiplication stage 20 and the multiplication block 20' are constituted by respective multiplication steps or multiplication elements $m_0, \ldots, m_{n-1}$, respectively. In order to realize the partial summations and therefore the partial sums $\Sigma p_k$ the pre-summation stage 31' and the pre-summation block 31 comprise respective pre-summation steps or pre-summation elements $pS_0, \ldots, pS_{k-1}$, respectively. The final summation stage 32' and the final summation block 32 comprise a final summation step and a final summation element fS, respectively. The multiplexing stage 33' and the multiplexing block 33 are adapted in order to multiplex the received partial sums $\Sigma p_k$.

According to the embodiment shown in FIG. 2 two pre-summation steps or elements $pS_0$ and $ps_1$ are given in order to generate two partial sums $\Sigma p_0$ and $\Sigma p_1$. Thereby, doubled multiplexed input signals inS=MS can be filtered.

According to the embodiment as shown in FIG. 3 three pre-summation steps and elements $pS_0, pS_1$, and $pS_2$ are provided in order to realize a filtering of a triple multiplexed input signal inS=MS.

REFERENCE SYMBOLS

1 FIR filter arrangement according to the present invention
1' FIR filter process according to the present invention
10 delay block
10' delay stage
20 multiplication block
20' multiplication stage
30 summation and output block
30' summation and output stage
31 pre-summation block
31' pre-summation stage
32 final summation block
32' final summation stage
33 multiplexing block
33' multiplexing stage
40 control block
40' control stage
$d_{j-1}$ delay element, delay process/step, $j=1, \ldots, n$
$dS_{j-1}$ delay signal, $j=1, \ldots, n$
F filtering operation
fs final summation element, final summation process/step
$h_{j-1}$ filter coefficient, $j=1, \ldots, n$
inS input signal
$iS_{j-1}$ intermediate filter signal, $j=1, \ldots, n$
$m_{j-1}$ multiplication element, multiplication process/step, $j=1, \ldots, n$
MS multiplexed signal
outS output signal
$pS_{k-1}$ partial summation element, partial summation process/step, $k=1, \ldots, K$
S single signal
$\Sigma$ final sum
$\Sigma p_{k-1}$ partial sum, $k=1, \ldots, K$
$\Delta t$ minimum delay time
$\Delta t_j$ delay time

The invention claimed is:

1. A method of demodulating a sound signal using an FIR filter process which is capable of being controllably and switchably operated in a single mode for filtering a single signal when the sound signal is a single signal and in at least one multiplex mode for filtering a multiplexed signal when the sound signal is a multiplexed signal, the method comprising:

generating, in a pre-summation stage, partial sums from intermediate filter signals obtained by an input signal by summing, from said intermediate filter signals, subsets which are assigned to a given component of the multiplexed input signal, wherein in said at least one multiplexed mode partial summations are carried out and controlled in conformity with a multiplex structure underlying said multiplexed signal in order to obtain the partial sums as accordingly filtered single signals;

generating, from said partial sums, an entire sum by adding an entirety of said partial sums in a controllable manner if and only if a single signal is given as said input signal in the single mode such that a single-signal sound signal is filtered using a large filter; and generating, from said partial sums, said filtered single signals represented by the partial sums in a controllable manner if and only if a multiplexed signal is given as said input signal in the at least one multiplex mode such that each component of a multiplexed sound signal is filtered using short filters.

2. The method according to claim 1, wherein, in said single mode, the method further comprises:
receiving the input signal constituted by a single signal;
generating the intermediate filter signals;
carrying out certain partial summations on the entirety of intermediate filter signals in order to obtain the respective partial sums;
summing the entirety of said intermediate filter signals in order to obtain an entire sum, wherein said entire sum is formed by summing said previously formed partial sums into one single value; and
outputting said entire sum as a single output signal and as a filtered single input signal.

3. The method according to claim 1, wherein, in said at least one multiplex mode, the method further comprises:
receiving the input signal constituted by a multiplex signal of a given and fixed number of multiplexed single signals with a given multiplexed structure;
generating the intermediate filter signals;
carrying out certain partial summations on the entirety of the intermediate filter signals in order to obtain respective partial sums,
wherein said partial summations are carried out and controlled in conformity with said multiplex structure of said multiplexed single signals in order to obtain said partial sums as accordingly filtered single signals.

4. The method according to claim 1, further comprising:
outputting said partial sums as output signals via separated channels.

5. The method according to claim 1 further comprising:
forming the entirety of said partial sums into a common multiplexed output signal; and
outputting the common multiplexed output signal.

6. The method according to claim 1, further comprising:
generating from said input signal n delayed signals with n and j being integers, n>1 and $1 \leq j \leq n$, with delay times being (j−1)-times a given minimum delay time.

7. The method according to claim 6, comprising:
generating from said delayed signals said intermediate filter signals by multiplying each of said delayed signals with a respective given filter coefficient.

8. A digital demodulator for a sound signal comprising:
an FIR filter arrangement that includes
a summation block configured to be operated in a single mode for filtering a single signal when the sound signal is a single signal and in at least one multiplex mode for filtering a multiplexed signal when the sound signal is a multiplexed signal,
wherein the summation block includes
a pre-summation block which is adapted to generate partial sums from intermediate filter signals obtained from an input signal by summing, from said intermediate filter signals, subsets,
wherein, in said at least one multiplexed mode, partial summations are carried out and controlled in conformity with the multiplex structure underlying said multiplexed signal in order to obtain the partial sums as accordingly filtered single signals, a final summation block which is adapted to generate from said partial sums an entire sum by adding an entirety of said partial sums in a controllable manner if and only if a single signal is given as said input signal in the single mode such that a single-signal sound signal is filtered using a large filter, and
a multiplexing block which is adapted to receive said partial sums and to generate from said partial sums said multiplexed output signal in a controllable manner if and only if a multiplexed signal is given as said input signal in the at least one multiplexed mode such that each component of a multiplexed sound is filtered using short filters.

9. The digital demodulator according to claim 8, wherein in said single mode:
the input signal is received, said input signal constituted by a single signal,
the intermediate filter signals are generated,
on the entirety of the intermediate filter signals certain partial summations are carried out in order to obtain respective partial sums and
the entirety of said intermediate filter signals is summed in order to obtain an entire sum, wherein said entire sum is formed by summing said previously formed partial sums into one single value, and
said entire sum is output as a single output signal and as a filtered single input signal.

10. The digital demodulator according to claim 8, wherein in said at least one multiplex mode:
the input signal is received and assumed to be a multiplex signal of a given and fixed number of multiplexed single signals with a given multiplexed structure,
the intermediate filter signals are generated,
on the entirety of the intermediate filter signals certain partial summations are carried out in order to obtain respective partial sums, and
said partial summations are carried out and controlled in conformity with said multiplex structure of said multiplexed single signals in order to obtain said partial sums as accordingly filtered single signals.

11. The digital demodulator according to claim 8, further comprising:
means for outputting said partial sums as output signals via separated channels.

12. The digital demodulator according to claim 8, further comprising:
means for forming and outputting the entirety of said partial sums as a common multiplexed output signal.

13. The digital demodulator according to claim 8, further comprising:
a delay block which is adapted to generate from said input signal n delayed signals with n and j being integers, n>1 and $1 \leq j \leq n$, in particular with delay times being (j−1)-times a given minimum delay time.

14. The digital demodulator according to claim 13, further comprising:
a multiplication block which is adapted to generate from said delayed signals said intermediate filter signals by multiplying each of said delayed signals with a respective given filter coefficient.

15. The digital demodulator according to claim 8, wherein the FIR filter arrangement is on a chip.

* * * * *